United States Patent [19]

Moriyama

[11] Patent Number: 5,151,699
[45] Date of Patent: Sep. 29, 1992

[54] DATA CONVERTING APPARATUS

[75] Inventor: Yoshiaki Moriyama, Tokorozawa, Japan

[73] Assignee: Pioneer Electronic Corporation, Japan

[21] Appl. No.: 855,113

[22] Filed: Mar. 18, 1992

Related U.S. Application Data

[63] Continuation of Ser. No. 675,666, Mar. 27, 1991, abandoned.

[30] Foreign Application Priority Data

Sep. 5, 1990 [JP]  Japan .................................. 2-235402

[51] Int. Cl.⁵ ............................................ H03M 5/14
[52] U.S. Cl. ...................................... 341/58; 341/68; 360/40
[58] Field of Search ........................ 341/58, 59, 68, 69, 341/70, 71, 72, 73, 74, 55; 360/40

[56] References Cited

U.S. PATENT DOCUMENTS

| 3,810,111 | 5/1974 | Patel | 341/58 X |
| 4,456,905 | 6/1984 | Odaka | 341/58 |
| 4,675,650 | 6/1987 | Coppersmith et al. | 341/58 |

FOREIGN PATENT DOCUMENTS

| 60-000667 | 5/1985 | Japan | 341/58 |
| 62-029322 | 2/1987 | Japan | 341/58 |

Primary Examiner—Howard L. Williams
Attorney, Agent, or Firm—Perman & Green

[57] ABSTRACT

A data converting apparatus inserts DC control bits in an input data series to generate a redundant data series. This apparatus determines the value of the DC control bits in such a way as to minimize the DC component of an output code series which is obtained by subjecting the redundant data series to code conversion. The apparatus performs code conversion after inserting the determined DC control bits.

20 Claims, 5 Drawing Sheets

DC --- CONVERTED DC CONTROL BIT    SYNC --- SYNC SIGNAL
DATA--- CONVERTED INPUT DATA SERIES

DATA CONVERTING APPARATUS

This is a continuation of copending application Ser. No. 07/675,666 filed on Mar. 27, 1991, now abandoned.

BACKGROUND OF THE INVENTION

1. Field of the Invention

The present invention relates to an apparatus for converting data when the data is to be recorded at high density on a recording medium or to be transmitted by a band-limited transmission system.

2. Description of the Related Art

In general, to record data, expressed in binary codes, on a recording medium at high density or transmit such data to a transmission system, the data needs to be converted to have a signal waveform suitable for high-density processing before recording or transmission. More specifically, data conversion is conducted such that, with respect to the signal waveform after the conversion, the minimum inversion period (hereinafter indicated by Tmin) is long while the maximum inversion period (hereinafter indicated by Tmax) is short. This is because longer Tmin reduces interference of adjacent inversions to thereby ensure high-density processing and shorter Tmax facilitates self-synchronization of clocks. Further, a transmission system, which does not transfer DC components, deforms the waveform of a signal to be transferred if the signal includes a DC component. It is therefore desirable that the data conversion eliminate the DC component.

An example of the data converting system, which satisfies these conditions, is disclosed in Japanese Unexamined Patent Publication No. 75353/1983. This system will be described below.

A train or series of input data is divided into consecutive 2-bit blocks as shown in (A) in FIG. 1. These blocks will be sequentially labeled $B_1$, $B_2$, $B_3$, $B_4$, ..., $B_7$ from the foremost block. The 2-bit binary codes of blocks other than every pair of adjoining blocks whose bits before and after the adjoining point are both "1" like those bits of $B_4$ and $B_5$, are sequentially converted into 3-bit binary codes in accordance with, for example, a conversion table as presented in Table 2. The 2-bit binary codes of those adjoining two blocks, like $B_4$ and $B_5$, whose bits before and after the adjoining point are both "1," are converted into 3-bit binary codes according to a conversion table as presented in Table 2. Sequential conversion from the foremost block can yield a series of codes as shown in (B) in FIG. 1, wherein the minimum and maximum numbers of "0"s present between the adjoining "1"s are one and seven, respectively. With "1" associated with inversion and "0" with non-inversion, Tmin takes a large value of 4/3·T while Tmax takes a value of 16/3·T where T is the bit interval before the conversion, thus ensuring self-synchronization.

After the above conversion, the second conversion is to be further carried out to eliminate a DC component. More specifically, the 3-bit binary codes of every l blocks are converted into 4-bit binary codes in accordance with a conversion table, such as Table 3, thus yielding a code series as shown in (C) in FIG. 1 wherein l=6. Table 3 shows three types of 3-bit binary-code patterns to each of which two types of 4-bit patterns $P_1$ and $P_2$ are assigned. These 3-bit patterns will be converted into either $P_1$ or $P_2$, whichever desirable to reduce the DC component of a final signal waveform after conversion. That is, either $P_1$ or $P_2$ is selected to make the absolute value of a DSV (Digital Sum Value) smaller; the DSV is the accumulated sum of values "+1" assigned to the level "1" of the signal waveform, and "−1" assigned to the level "0" of that waveform. For instance, with the DSV being "0" at a point a in (C) in FIG. 1, the DSV at a point b is "−1". The first block in (C) in FIG. 1 is converted into "1000" because if it were converted into "1010", the DSV at the point b would become "+5." The three 4-bit patterns, "0000", "0001" and "1000" are selectable only when Tmax is not greater than 16/3·T, namely when "0" does not appear eight times or more consecutively. If the conversion shown in Table 3 is effected for every l blocks, Tmin and Tmax will be expressed as follows through the data conversion given in Tables 1 to 3.

$$T\text{min} = \frac{3l}{3l+1} \cdot \frac{4}{3} T \qquad T\text{max} = \frac{3l}{3l+1} \cdot \frac{16}{3} T.$$

This data conversion system realizes longer Tmax and shorter Tmax as well as the elimination of the DC component in the above manner. Since this system performs the second conversion every l blocks, however, it needs a buffer memory having a capacity of 3l+1 bits or greater to average the data rate of the output code series. This complicates the circuit configuration. In addition, it is necessary to prevent Tmax from exceeding its limit at the time of selecting the 4-bit pattern. The selection may not always be so made as to set the DSV small. The value for l therefore cannot be set very large, thus increasing the redundancy originating from the second conversion to eliminate the DC component.

TABLE 1

| Input Data | After Conversion |
|---|---|
| 00 | 010 |
| 01 | 001 |
| 10 | 100 |
| 11 | 101 |

TABLE 2

| Input Data | After Conversion |
|---|---|
| 01 · 10 | 010 · 000 |
| 01 · 11 | 001 · 000 |
| 11 · 10 | 100 · 000 |
| 11 · 11 | 101 · 000 |

TABLE 3

| Data in FIG. 1(B) | After Conversion |
|---|---|
| 010 | $P_1$ 0010 |
|  | $P_2$ 0000 |
| 001 | $P_1$ 0101 |
|  | $P_2$ 0001 |
| 100 | $P_1$ 1010 |
|  | $P_2$ 1000 |
| 000 | $P_1$ 0100 |
| 101 | $P_2$ 0000 |

A description will now be given of another DC component eliminating system as disclosed, for example, Japanese Examined Patent Publication No. 27510/1989. According to this system, input binary data is converted into a code-converted bit series so as to provide the desired Tmin and Tmax, then this bit series is divided into N-bit blocks (N=integer), and a redundancy bit consisting of M bits (M=integer) is inserted between consecutive two blocks. Then, DSV control is executed to eliminate the DC by the value of the redundancy bit within the range to meet the limit of Tmin. That is, this system inserts a redundancy bit to eliminate the DC component in place of the second conversion done in the previously-described system. It is however necessary to control the DSV without breaking the limit of Tmin by the redundancy bit. Therefore, if the number of the redundancy bits, M, is set small, the degree of freedom will result in insufficient DSV control. With regard to Tmax, no specific measure is taken against Tmax exceeding its limit. If one tries to set Tmax within the limit, however, the degree of freedom will further diminish. To realize sufficient DSV control, therefore, M cannot be set so small while N cannot be set so large. This restriction inevitably increases the redundancy to eliminate the DC component.

SUMMARY OF THE INVENTION

It is therefore an object of the present invention to provide a data converting apparatus capable of realizing the desired Tmin and Tmax and eliminating the DC component with a simple structure as well as small redundancy.

To achieve this object, a data converting apparatus according to the present invention comprises a means for inserting DC control bits consisting of a predetermined number of bits into an input data series, expressed in binary codes, at a predetermined bit interval to thereby generate a redundant data series, and means for subjecting the redundant data series to code conversion in accordance with given conversion rules to generate an output data series, whereby a DC component of the output data series is controlled by the DC control bits.

DETAILED DESCRIPTION OF THE PREFERRED EMBODIMENT

Figure 1:
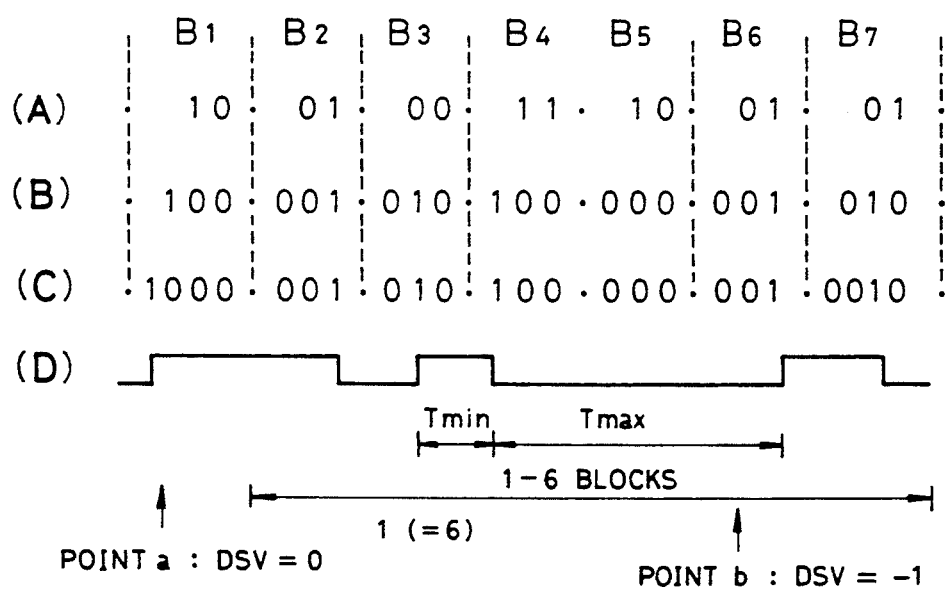
FIG. 1 is a diagram illustrating an example of conventional data conversion.
Figure 2:
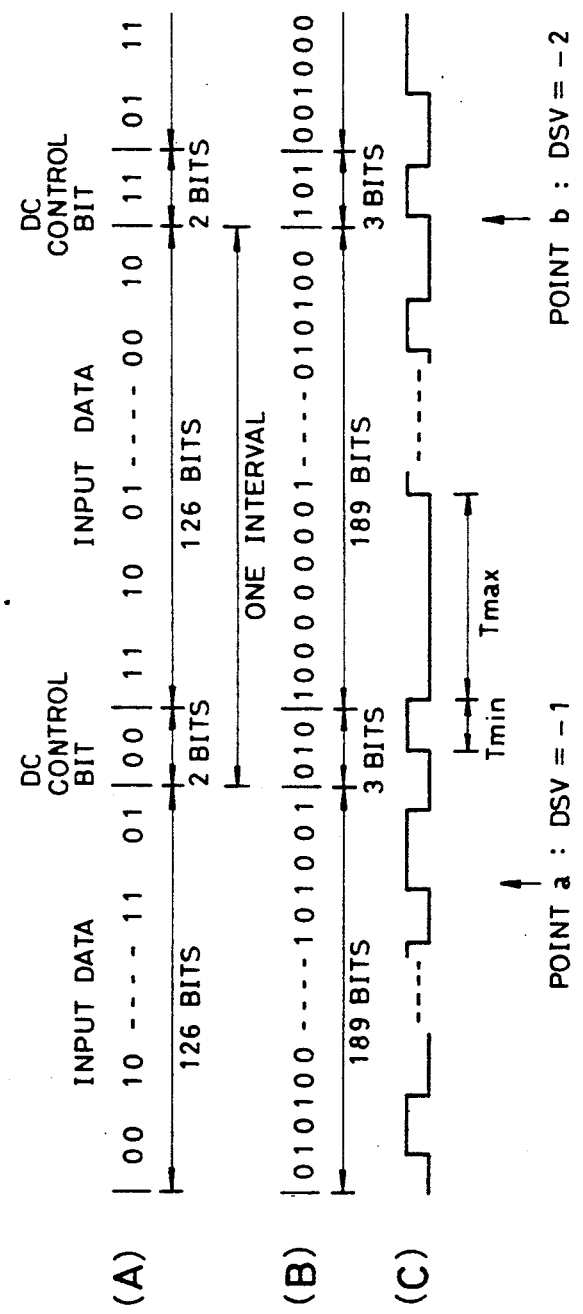
FIGS. 2 and 3 are diagrams exemplifying data conversion according to the present invention.

A preferred embodiment of the present invention will now be described referring to the accompanying drawings. FIG. 2 exemplifies data conversion according to the present invention. As shown in (A) in FIG. 2, DC control bits consisting of a predetermined number of bits (two bits in the diagram) are inserted into an input data series at a given interval (126 bits in this diagram), thereby yielding a redundant data series. Then, the redundant data series is subjected to code conversion to provide the desired Tmin and Tmax. According to this embodiment, the conversion is executed in accordance with Tables 1 and 2 given earlier. The resultant output code series will be as shown in (B) in FIG. 2. FIG. 2, (C) shows the output waveform which will be obtained. Referring to (A) in FIG. 2, for each DC control bit, either "00" or "11" is to be so selected as to make smaller the absolute value of the DSV of the output waveform shown in (C) in FIG. 2. For instance, assuming that with the DSV at the point a in the output waveform being "+1", if the next DC control bit is "00" or "11", the value of the DSV at the point b is "−2" or "+6" accordingly, then "00" will be selected which makes the absolute value of the DSV smaller. Although the DSV control is executed in this manner, since the redundant data series having the selected DC control bit inserted therein as indicated in (A) in FIG. 2 is subjected to code conversion to acquire the output code series shown in (B) in this diagram, the desired Tmin and Tmax will be realized by the code conversion regardless of the DSV control. According to this embodiment using the conversion involving Tables 1 and 2, $$T\text{min} = \frac{4}{3} T \quad T\text{max} = \frac{16}{3} T$$

where T is the bit interval of the redundant data series.

Figure 3:
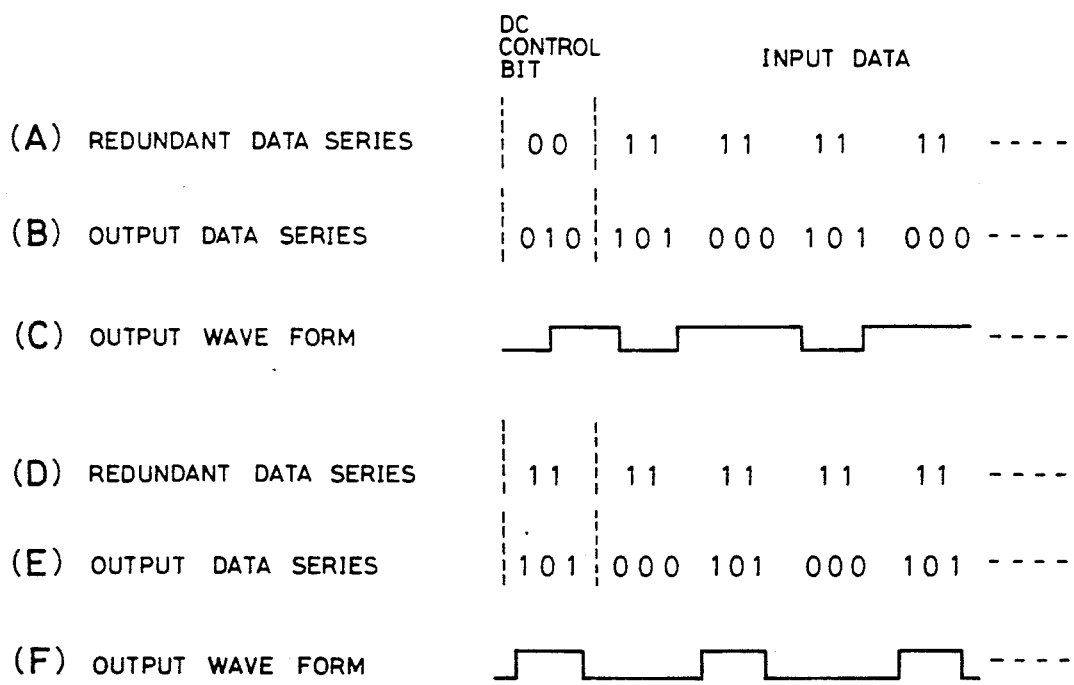

The method of converting the redundant data series into the output code series is not limited to the above particular type, but other methods may be used as well in accordance with the desired Tmin and Tmax. Among various code conversion systems, the conversion involving Tables 1 and 2 as used in this embodiment is particularly suitable for the present invention. When either "00" or "11" is selected as the DC control bit, "00" is converted into "010" according to Table 1, and "11" into "101" or "000" according to Table 1 or 2. As "1" and "0" respectively correspond to inversion and non-inversion, inversion is performed once after the conversion when "00" is selected as the DC control bit, while inversion is done twice or no inversion is done at all after the conversion when "11" is selected. In the case of "00", therefore, the polarity of the output waveform will be reversed to that in the case of "11" after the DC control bit, so will be the increase and decrease in DSV. Selecting either one of the values can always set the absolute value of the DSV smaller When "11"s run in succession after the DC control bit as shown in FIG. 3, the combination of blocks for the conversion based on Table 2 for the DC control bit of "00" differs from the combination for the DC control bit being "11". The phase of the output waveform therefore differs between these two selections. But, since the increase and decrease in DSV for one selection is kept reversed to that for the other selection, the DSV control can be executed in this case in the same manner.

Figure 4:
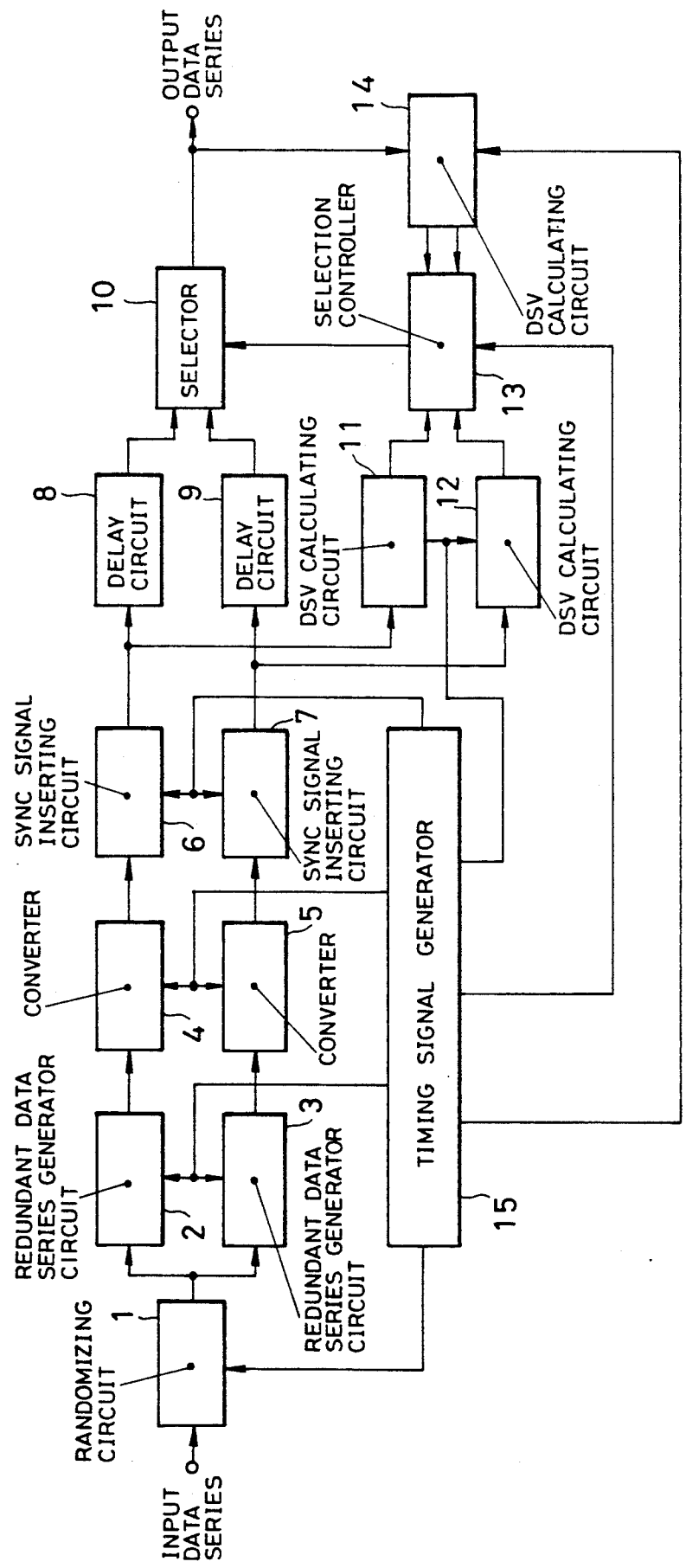
FIG. 4 is a block diagram showing a data converting apparatus according to the present invention.

FIG. 4 is a block diagram illustrating one embodiment of a data converting apparatus according to the present invention. Referring to this diagram, the data converting apparatus comprises a randomizing circuit 1, redundant data series generator circuits 2 and 3, converters 4 and 5, sync signal inserting circuits 6 and 7, delay circuits 8 and 9, a selector 10, DSV calculating circuits 11 and 12, a selection controller 13, a DSV calculating circuit 14, and a timing signal generator 15. The randomizing circuit 1 randomizes input data series. The generator circuits 2 and 3 respectively insert either "00" or "11" as the DC control bit into the randomized input data series to generate a redundant data series. The converters 4 and 5 convert the redundant data series in accordance with Tables 1 and 2. The sync signal inserting circuits 6 and 7 insert a sync signal into the redundant data series after conversion. The delay circuits 8 and 9 provide a delay of 192 bits. The selector 10 selects either the delay circuit 8 or the delay circuit 9 and sends out the output of the selected delay circuit. The DSV calculating circuits 11 and 12 acquire the DSV of the signal waveform after conversion for each interval, which runs from the forefront of the DC control bit (e.g., the point a in FIG. 2) to immediately before the next DC control bit (e.g., the point b in FIG. 2). The selection controller 13 controls the selection of the selector 10. The DSV calculating circuit 14 obtains the DSV of the signal waveform of the output code series. The timing signal generator 15 supplies a timing signal to each section of the data converting apparatus.

The operation of the data converting apparatus will now be described.

An input data series input to the randomizing circuit 1 and a random series a which is generated in the timing signal generator 15 in synchronism with a sync signal, are subjected to an exclusive-OR operation, yielding a randomized input data series to be sent to the redundant data series generator circuit 2 and the redundant data series generator circuit 3.

In the generator circuit 2, the DC control bit "00" is inserted in the randomized input data series every 126 bits, in synchronism with a DC control bit inserting pulse b from the timing signal generator 15, yielding a redundant data series to be sent to the converter 4. The converter 4 converts the received redundant data series in accordance with Tables 1 and 2 in response to a conversion pulse c from the timing signal generator 15 and outputs the converted data. The output of the converter 4 is sent to the sync signal inserting circuit 6 to insert a predetermined sync signal in response to a sync signal inserting pulse d from the timing signal generator 15. The sync signal in this case may be of a series with the maximum inversion interval appearing twice in a row. The output of the inserting circuit 6 is supplied to the delay circuit 8 and the DSV calculating circuit 11. The delay circuit 8 delays the input by 192 bits, and sends the result to the selector 10. The DSV calculating circuit 11 is reset in response to a reset pulse e from the timing signal generator 15 immediately before the beginning of each interval, which, in the output waveform of the inserting circuit 6, ranges from the head of DC control bit to immediately before the next DC control bit. This circuit 11 then calculates the DSV for each interval to send it to the selection controller 13. The DSV is obtained as follows. With regard to the obtained signal waveform whose level is considered as "0" when the reset pulse e is supplied, and whose level is thereafter inverted every time a "1" is output from the inserting circuit 6, the calculating circuit 11 assigns "−1" to the level "0" and "+1" to the level "1", and then accumulates the assigned values to obtain the DSV. The input data series is also input to the redundant data series generator circuit 3 where "11" is inserted instead of "00" as the DC control bit. Thereafter, the same processing as described above is executed in the converter 5, the sync signal inserting circuit 7, the delay circuit 9 and the DSV calculating circuit 12. The level of the signal waveform of the output code series and the initial value of the DSV are reset to "0" in response to an initial reset pulse g from the timing signal generator 15, and thereafter the level of the signal waveform will be inverted every time a "1" is output from the output code series. The DSV calculating circuit 14 calculates the DSV for this signal waveform in the same manner as described above. It is to be noted however that the calculating circuit 14 does not reset the DSV for each interval, but acquires the accumulated value of the DSVs from the initial state. While the signal at the point a in FIG. 2 is output from the output code series, and the DSV value and the signal level at the point a are sent to the selection controller 13 from the calculating circuit 14, the outputs of the sync signal inserting circuits 6 and 7 become the signal at the point b in FIG. 2, and the DSVs for the interval from the point a to the point b are sent to the selection controller 13 from the DSV calculating circuits 11 and 12.

At this time, in response a selection control pulse f from the timing signal generator 15, the selection controller 13 inverts the sign (positive or negative) of the DSV from each of the calculating circuits 11 and 12 when the level of the input signal from the calculating circuit 14 is "1" and leaves this sign intact when the level of the input signal is "0". This is because the computation of the DSVs in the calculating circuits 11 and 12 is premised on that the signal level at the beginning of each interval is "0", so that the actual signal level at the beginning of each interval is "1", the actual DSVs would be the computed DSVs with their signs inverted. Further, the selection controller 13 adds each actual DSV acquired in this manner to the DSV output from the calculating circuit 14, and controls the selector 10 in such a way as to output one data series which makes the absolute value of the added result smaller. In other words, the selection controller 13 sends a control signal to the selection controller so that the selector 10 selects the output of the sync signal inserting circuit 6 when adding the actual DSV from the calculating circuit 11 to the output of the calculating circuit 14 makes the absolute value of the resultant DSV smaller, but the selector 10 selects the output of the sync signal inserting circuit 7 when adding the actual DSV from the calculating circuit 12 makes the absolute value of the DSV smaller. In this manner, the output code series in the next one interval to the point b is determined when the output of the selector 10 becomes the one at the point a, and the value of the control signal from the selection controller 13 is so determined that the output code series becomes the output of the selector 10 and is held during one interval. After the point b, the value of the DC control bit and the output code series for each interval are likewise determined and output.

Figure 5:
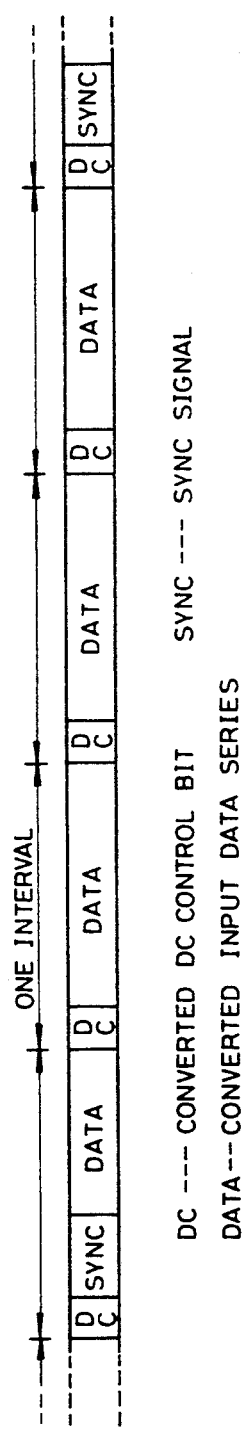
FIG. 5 is a diagram showing an example of the output code series provided by the data converting apparatus shown in FIG. 4.

FIG. 5 exemplifies this output code series. The duration for inserting the DC control bit may be taken as one interval, with the sync signal inserted every multiple intervals as illustrated. The sync signal may be inserted every interval. If the sync signal in the series does not contain DC components, the sync signal inserting circuits 6 and 7 in FIG. 4 may be eliminated so that the output of each converter is sent directly to the associated circuit at the subsequent stage, and a single sync signal inserting circuit may be connected to the output of the selector 10 so that the output from the inserting circuit can be used as the output code series and be supplied to the DSV calculating circuit 14. Only one sync signal inserting circuit is sufficient in the above case. When the number of "1" included in the sync signal is an odd number, however, the DSV after the insertion of the sync signal is also inverted thereafter. In the interval where the sync signal is inserted, therefore, the DSV after the sync signal should be inverted, and then calculated by the DSV calculating circuits 11 and 12.

Figure 6:
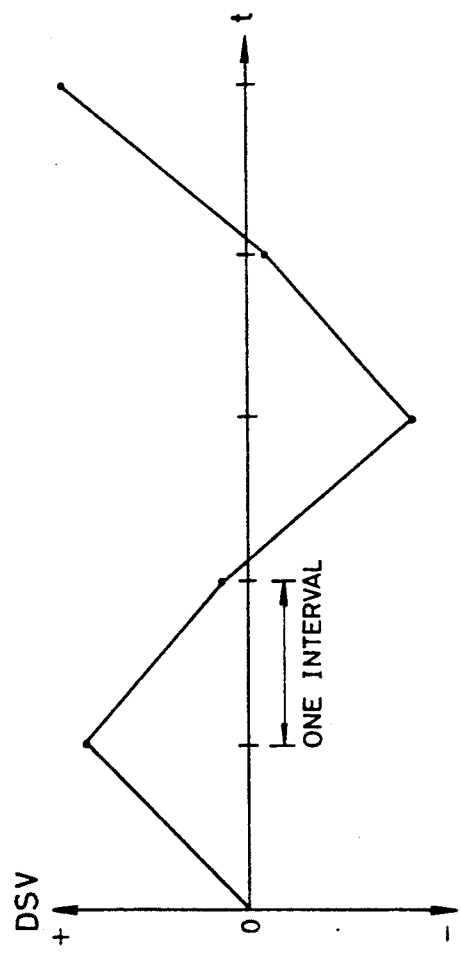
FIG. 6 is a graph exemplifying a change in DSV.

The randomizing circuit 1 in FIG. 4 randomizes the input data series and diffuses the frequency components. When data containing many DC components appear consecutively in the input data series, if randomization is not performed, the DSV will be accumulated in each interval and inverted by the DC control bit. As a result, a graph or waveform representing a change in the DSV may become as shown in FIG. 6. When Ts is the length of one interval, this waveform intensively contains the frequency component, $f_L = 1/(4Ts)$. Since the DSV is what a signal waveform is integrated, the signal waveform has strongly the component of $f_L$ accordingly. The longer Ts becomes, the lower the frequency $f_L$. Therefore, the waveform may be deformed in a transmission system where the DC components and low frequency components are not sent, while focus and tracking servo signals in a recording and reproducing device such as an optical disk may be adversely influenced. To prevent such troubles, the input data series should be randomized to contain fewer DC components in the data series. When Ts is short and $f_L$ is relatively high, or when data containing many DC components does not appear consecutively in the input data series, the randomizing circuit 1 will not be necessary. An M series may be used for the random series a. For example, a random series generator in the timing signal generator 15 is reset in synchronism with the sync signal so that the data series will always be constant in the cycle of the sync signal interval. If some information is inserted in the output code series to specify the beginning of the random series a, the random series a may be reset every plural intervals of the sync signal.

The output code series shown in FIG. 4 then undergoes NRZI modulation so as to yield a signal waveform whose "1" level indicates inversion and "0" level indicates noninversion before the output code series is recorded or transmitted.

At the time of reproducing or receiving data, the NRZI-modulated output code series is demodulated, the location of the DC control bit is detected using the detected sync signal as a reference, and then the DC control bit is eliminated after execution of the reverse conversions to those shown in Tables 1 and 2, thus restoring the data series. When the data series has undergone randomization, the beginning of the random series a is detected on the basis of the sync signal or pre-inserted positional information, and the same series and the restored data series are subjected to an exclusive-OR operation to cancel the randomization.

Although the code conversion of the redundant data series is based on Tables 1 and 2 according to this embodiment, the code conversion system is not restricted in this invention, but other available code conversion systems may also be used. Although either "00" or "11" is selected as the DC control bit in this embodiment, other possible values may be added as possible candidates for the DC control bit and the desired one value may be selected from the resultant selection group. More specifically, as the DC control bit is expressed by two bits, the DC control bit can take the values of "10" and "01" in addition to "00" and "11", so that one value may be selected from those four. If the number of bits forming the DC control bit increases, the selection can be made from a greater number of candidates. Although increasing the number of candidates increases the freedom of selection for more effective elimination of the delay circuit, it is necessary to evaluate the DSV for each candidate to make the final choice, thus enlarging the circuit scale.

According to the present invention, as described above, in preparing a redundant data series by inserting DC control bits consisting of a predetermined number of bits into an input data series at a predetermined interval, the value of the DC control bit is so determined as to remove the DC component of an output code series, obtained by subjecting the redundant data series to code conversion, and the code conversion will be performed after the determined DC control bit is inserted whereby the freedom of the DC control is increased and the DC component can be eliminated with a simple structure and less redundancy without adverse influence of the limit of Tmin and Tmax. Since the code conversion system is selectable independently of the DC control, this data converting apparatus can be combined with any conventional code conversion system to realize the desired Tmin and Tmax. In particular, using the code conversion systems illustrated in Tables 1 and 2 can yield $$T\min = \frac{4}{3} T \quad T\max = \frac{16}{3} T$$

and in this case because the direction of a change in DSV for one selection of the DC control bit (e.g., "00") is reversed to that for the other selection ("11"), the DC component can efficiently be eliminated.

What is claimed is:

1. A data converting apparatus for converting an input data series being expressed in binary codes into an output data series, which comprises:
    insertion means for repetitively inserting one of a predetermined number of DC control bits into an input data series, at every predetermined bit interval to thereby generate a redundant data series;
    encoding means for subjecting said redundant data series to a code conversion operation under a preselected conversion rule so as to generate said output data series; and
    selection means for selecting a binary code for said one of predetermined number of DC control bits as a function of a DC component of said output data series.

2. A data converting apparatus according to claim 1, and further comprising means for acquiring the output data series for each of two or more data values prepared in advance as the DC control bits, and determining any one of the data values as redundant data by referring to a result of DC control of the output data series.

3. Apparatus for converting an input data series, comprising:
    a first data conversion channel comprising a first redundant data series generator means having an input coupled to an input data series and an output coupled to an input of a first code converter means, said first code converter means having an output coupled to a first input of a selector means, said first redundant data series generator means inserting a first code into said input data series at predetermined intervals;
    a second data conversion channel comprising a second redundant data series generator means having an input coupled to the input data series and an output coupled to an input of a second code converter means, said second code converter means having an output coupled to a second input of said selector means, said second redundant data series generator means inserting a second code into said input data series at the predetermined intervals, said selector means having an output for expressing an output data series, the output data series being either said input from said first code converter means or said input from said second code converter means;

first digital sum value calculating means having an input coupled to said output of said first code converter means;

second digital sum value calculating means having an input coupled to said output of said second code converter means;

third digital sum value calculating means having an input coupled to said output of said selector means for receiving said output data series therefrom; and control means having inputs coupled to an output of said first digital sum value calculating means, an output of said second digital sum value calculating means, and an output of said third digital sum value calculating means, said control means having an output coupled to said selecting means and, responsive to said outputs of said first, second, and third digital sum value calculating means, controlling said output to select either the first input or the second input to said selector means to appear as said output data series so as to minimize an absolute value of the digital sum value of the output data series.

4. Apparatus as set forth in claim 3 and further comprising means, coupled to the input of said first and said second redundant data series generator means, for randomizing said input data series so as to diffuse frequency components thereof.

5. Apparatus as set forth in claim 3 and further comprising:

first means, interposed between said output of said first code converter means and said first input of said selector means, for inserting a synchronizing signal into said output of said first code converter means; and second means, interposed between said output of said second code converter means and said second input of said selector means, for inserting a synchronizing signal into said output of said second code converter means.

6. Apparatus as set forth in claim 3 and further comprising:

first means, interposed between said output of said first code converter means and said first input of said selector means, for delaying said output of said first code converter means by a predetermined number of bits; and second means, interposed between said output of said second code converter means and said second input of said selector means, for delaying said output of said second code converter means by the predetermined number of bits.

7. Apparatus as set forth in claim 6 wherein the predetermined number of bits equals 192.

8. Apparatus as set forth in claim 3 wherein said first code is comprised of two binary zeros and wherein said second code is comprised of two binary ones.

9. Apparatus as set forth in claim 8 wherein said first code converter means converts said two binary zeros into a three bit code of "010" and wherein said second code converter means converts said two binary ones into a first three bit code of "101" or into a second three bit code of "000".

10. Apparatus as set forth in claim 3 wherein each of said predetermined intervals has a duration of 126 bits.

11. Apparatus as set forth in claim 3 and further comprising means for resetting said first and said second digital sum value calculating means prior to the beginning of each of said predetermined intervals.

12. Apparatus as set forth in claim 3 wherein said control means includes:

means for adding the output of said first digital sum value calculating means to said output of said third digital sum value calculating means;

means for adding the output of said second digital sum value calculating means to said output of said third digital sum value calculating means; and means, responsive to a sum obtained by said first adding means and to a sum obtained by said second adding means, for controlling said output to select either the first input or the second input to said selector means.

13. Apparatus as set forth in claim 3 and further comprising means for NRZI modulating said output data series.

14. A method of operating a data converting apparatus so as to minimize a DC component of an output thereof, comprising the steps of:

inserting into an input data series, at predetermined bit intervals, a plurality of encoded control bits so as to generate a redundant data series;

code converting, in accordance with a preselected conversion rule, the redundant data series to generate an output data series; wherein the step of inserting includes a step of selecting a binary code for the inserted control bits as a function of a DC component of the output data series as determined by a step of obtaining a digital sum value of the output data series; and NRZI modulating the output data series.

15. A method as set forth in claim 14 wherein the step of inserting includes an initial step of randomizing the input data series so as to diffuse frequency components thereof.

16. A method as set forth in claim 14 wherein the step of code converting includes a further step of inserting a synchronizing signal into the code converted redundant data series.

17. A method as set forth in claim 16 wherein the step of inserting a synchronizing signal is followed by a step of delaying the code converted and synchronized redundant data series by a predetermined number of bits.

18. A method as set forth in claim 17 wherein the predetermined number of bits equals 192.

19. A method as set forth in claim 14 wherein each of said predetermined intervals has a duration of 126 bits.

20. A data converting apparatus for converting an input data series being expressed in binary codes into an output data series, which comprises:

DC control code insertion means for repetitively inserting a plurality of DC control codes into said input data series at every predetermined bit interval so as to produce a plurality of redundant data series, each containing one of said DC control codes at said predetermined bit interval;

encoding means for subjecting said redundant data series to a code conversion operation under a preselected conversion rule, respectively, so as to produce encoded data series;

DSV detection means for detecting DSV's for said encoded data series, respectively, for every period of said predetermined bit interval; and selection means for selecting either one of said encoded data series for every period of said predetermined bit interval while comparing the detected DSV's with each other so as to produce said output data series.

* * * * *